United States Patent
Kwag

(10) Patent No.: US 11,961,855 B2
(45) Date of Patent: Apr. 16, 2024

(54) IMAGE SENSING DEVICE

(71) Applicant: SK hynix Inc., Icheon-si (KR)

(72) Inventor: Pyong Su Kwag, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 171 days.

(21) Appl. No.: 17/232,116

(22) Filed: Apr. 15, 2021

(65) Prior Publication Data

US 2022/0102401 A1   Mar. 31, 2022

(30) Foreign Application Priority Data

Sep. 28, 2020   (KR) .................. 10-2020-0126087

(51) Int. Cl.
*H01L 27/146* (2006.01)
*H01L 27/148* (2006.01)

(52) U.S. Cl.
CPC .. *H01L 27/14612* (2013.01); *H01L 27/14831* (2013.01)

(58) Field of Classification Search
CPC ................................. H01L 27/14612
See application file for complete search history.

(56) References Cited

U.S. PATENT DOCUMENTS

| | | | |
|---|---|---|---|
| 9,040,897 B2 | 5/2015 | Huang | |
| 10,510,796 B1 | 12/2019 | Wang et al. | |
| 10,727,268 B1* | 7/2020 | Xu | H01L 27/14641 |
| 11,218,653 B2* | 1/2022 | Yang | H01L 27/14609 |
| 2006/0175536 A1 | 8/2006 | Kim et al. | |
| 2013/0049082 A1* | 2/2013 | Kato | H01L 27/14603 |
| | | | 257/292 |
| 2014/0151531 A1* | 6/2014 | Yamashita | H01L 27/14643 |
| | | | 257/435 |
| 2017/0048471 A1* | 2/2017 | Anaxagoras | H04N 25/75 |
| 2017/0373107 A1* | 12/2017 | Koga | H01L 27/146 |

(Continued)

FOREIGN PATENT DOCUMENTS

| | | |
|---|---|---|
| CN | 110544699 A | 12/2019 |
| KR | 100782308 B1 | 12/2007 |

(Continued)

OTHER PUBLICATIONS

Office Action mailed Feb. 7, 2024 for Chinese Patent Application No. 202110359697.1.

*Primary Examiner* — Benjamin P Sandvik
(74) *Attorney, Agent, or Firm* — Perkins Coie LLP

(57) ABSTRACT

An image sensing device includes a first subpixel block, a second subpixel block, a first conversion gain transistor, and a second conversion gain transistor. The first subpixel block includes a first floating diffusion region and a plurality of unit pixels sharing the first floating diffusion region. The second subpixel block includes a second floating diffusion region coupled to the first floating diffusion region and a plurality of unit pixels sharing the second floating diffusion region. The first conversion gain transistor includes a first impurity region coupled to the first and second floating diffusion regions and a second impurity region coupled to a first conversion gain capacitor. The second conversion gain transistor includes a third impurity region coupled to the second impurity region of the first conversion gain transistor and a fourth impurity region coupled to a second conversion gain capacitor.

9 Claims, 7 Drawing Sheets

(56) References Cited

U.S. PATENT DOCUMENTS

| | | |
|---|---|---|
| 2018/0191974 A1 | 7/2018 | Shim et al. |
| 2019/0191109 A1 | 6/2019 | Mo et al. |
| 2023/0039542 A1* | 2/2023 | Seo ..................... H04N 25/771 |
| 2023/0064181 A1* | 3/2023 | Chen .................... H04N 25/59 |

FOREIGN PATENT DOCUMENTS

| | | |
|---|---|---|
| KR | 20180079519 A | 7/2018 |
| KR | 20180113726 A | 10/2018 |
| TW | 200729471 A | 8/2007 |

* cited by examiner

IMAGE SENSING DEVICE

CROSS-REFERENCE TO RELATED APPLICATION

This patent document claims the priority and benefits of Korean patent application No. 10-2020-0126087, filed on Sep. 28, 2020, which is incorporated by reference in its entirety as part of the disclosure of this patent document.

TECHNICAL FIELD

The technology and implementations disclosed in this patent document generally relate to an image sensing device.

BACKGROUND

An image sensing device is used in electronic devices to convert optical images into electrical signals. With the recent development of automotive, medical, computer and communication industries, the demand for highly integrated, higher-performance image sensors has been rapidly increasing in various electronic devices such as digital cameras, camcorders, personal communication systems (PCSs), video game consoles, surveillance cameras, medical micro-cameras, robots, etc.

With the improvement of the resolution of image sensors, imaging pixels contained in the image sensors continue to shrink in size to allow the image sensors to have more imaging pixels without increasing their chip sizes.

SUMMARY

Various embodiments of the disclosed technology relate to an image sensing device capable of enabling capacitance of a floating diffusion region to be changed in various sizes.

In an embodiment of the disclosed technology, an image sensing device may include a first subpixel block including a first floating diffusion region and a plurality of unit pixels sharing the first floating diffusion region, a second subpixel block including a second floating diffusion region and a plurality of unit pixels sharing the second floating diffusion region, the second floating diffusion region being coupled to the first floating diffusion region, a first conversion gain transistor including a first impurity region coupled to the first and second floating diffusion regions and a second impurity region coupled to a first conversion gain capacitor, and a second conversion gain transistor including a third impurity region coupled to the second impurity region of the first conversion gain transistor and a fourth impurity region coupled to a second conversion gain capacitor.

In another embodiment of the disclosed technology, an image sensing device may include a pixel array including a plurality of subarrays consecutively arranged in the pixel array, each subarray including a first unit pixel block and a second unit pixel block adjacent to each other. Each of the first and second unit pixel blocks may include a first subpixel block including a first floating diffusion region and a plurality of unit pixels sharing the first floating diffusion region, a second subpixel block including a second floating diffusion region and a plurality of unit pixels sharing the second floating diffusion region, and a first transistor array and a second transistor array respectively disposed at opposing sides of the first subpixel block. The second floating diffusion may be configured to form a common floating diffusion node by connecting to the first floating diffusion region. The first transistor array may include a plurality of conversion gain transistors configured to adjust a capacitance of the common floating diffusion node based on a plurality of conversion gain control signals, and a reset transistor configured to initialize the common floating diffusion node based on a reset signal. The first transistor array of the first unit pixel block and the first transistor array of the second unit pixel block may be arranged symmetrically.

In another embodiment of the disclosed technology, an image sensing device may include a first subpixel block configured to include a first floating diffusion region and a plurality of unit pixels sharing the first floating diffusion region, a second subpixel block configured to include a second floating diffusion region coupled to the first floating diffusion region and a plurality of unit pixels sharing the second floating diffusion region, a first conversion gain transistor located at one side of the first subpixel block in a first direction and configured to include a first source/drain region coupled to the first and second floating diffusion regions and a second source/drain region coupled to a first conversion gain capacitor, and a second conversion gain transistor located at one side of the first conversion gain transistor in a second direction perpendicular to the first direction and configured to include a first source/drain region coupled to a second source/drain region of the first conversion gain transistor and a second source/drain region coupled to a second conversion gain capacitor.

In another embodiment of the disclosed technology, an image sensing device may include a pixel array in which a first unit pixel block and a second unit pixel block adjacent to the first unit pixel block are consecutively arranged while being paired with each other. Each of the first and second unit pixel blocks may include a first subpixel block configured to include a first floating diffusion region and a plurality of unit pixels sharing the first floating diffusion region, a second subpixel block configured to include a second floating diffusion region that forms a common floating diffusion (CFD) node by connecting to the first floating diffusion region and a plurality of unit pixels sharing the second floating diffusion region, and a first transistor array and a second transistor array respectively disposed at both sides of the first subpixel block in a first direction. The first transistor array may include a plurality of conversion gain transistors configured to change capacitance of the common floating diffusion (CFD) node based on a plurality of conversion gain control signals, and a reset transistor configured to initialize capacitance of the common floating diffusion (CFD) node based on a reset signal. The first transistor array of the first unit pixel block and the first transistor array of the second unit pixel block may be arranged in a flip structure.

It is to be understood that both the foregoing general description and the following detailed description of the disclosed technology are illustrative and explanatory and are intended to provide further explanation of the disclosure as claimed.

DETAILED DESCRIPTION

This patent document provides implementations and examples of an image sensing device and the disclosed features may be implemented to achieve one or more advantages in imaging applications. Some implementations of the disclosed technology suggest designs of an image sensing device which can allow the capacitance of a floating diffusion region to be adjusted.

Figure 1:
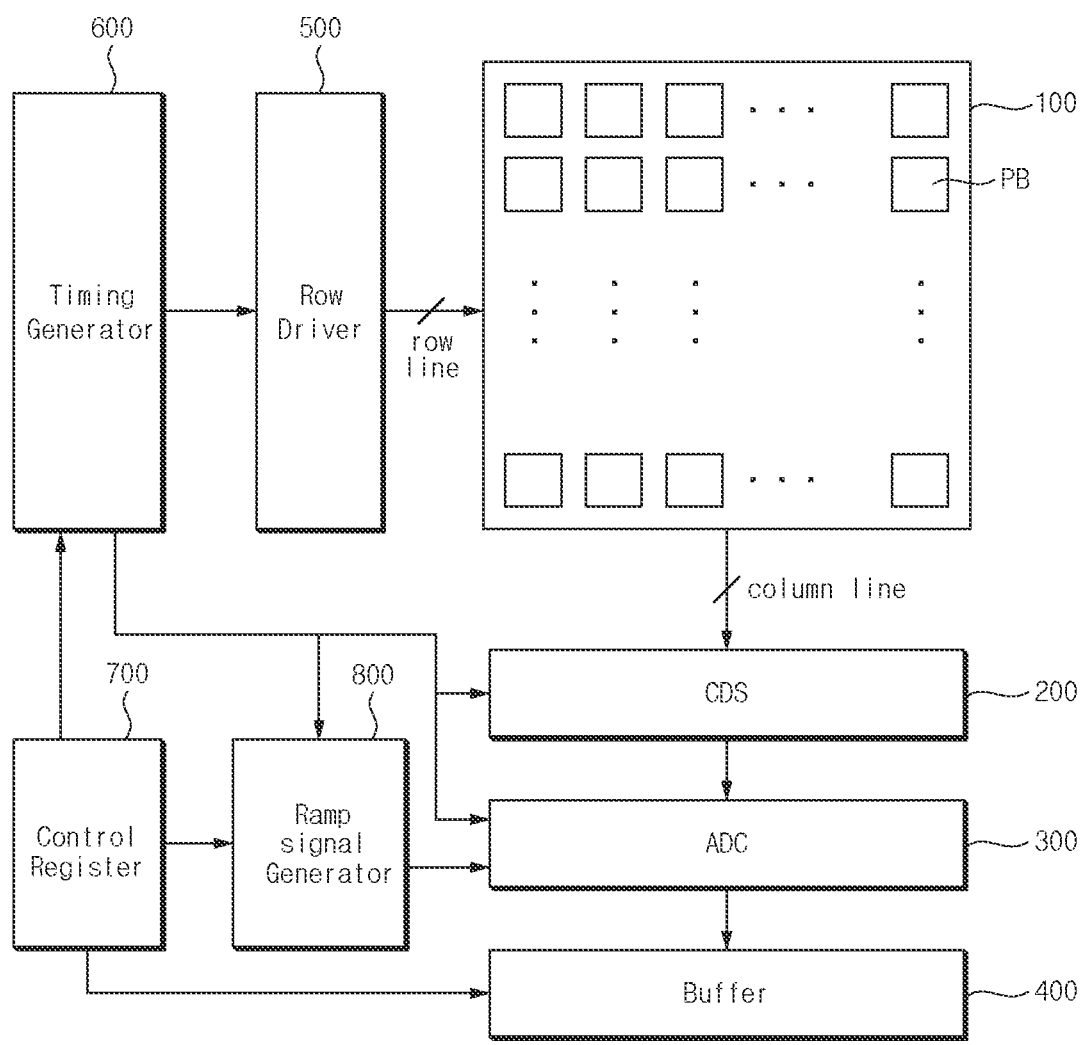
FIG. 1 is a schematic diagram illustrating an example layout of an image sensing device based on some implementations of the disclosed technology.

FIG. 1 is a block diagram illustrating an example of an image sensing device based on some implementations of the disclosed technology.

Referring to FIG. 1, the image sensing device may include a pixel array 100, a correlated double sampler (CDS) 200, an analog-to-digital converter (ADC) 300, a buffer 400, a row driver 500, a timing generator 600, a control register 700, and a ramp signal generator 800.

The pixel array 100 may include a plurality of unit pixel blocks (PBs) arranged in a matrix including columns and rows. Each unit pixel block (PB) may include a plurality of unit pixels configured to share a floating diffusion region and pixel transistors with each other. For example, the unit pixel block (PB) may be formed as an 8-shared pixel structure in which multiple unit pixels (e.g., 8 unit pixels) share a common floating diffusion region that provides a pixel block readout of the photocharge generated in the multiple unit pixels of the unit pixel block PB, a reset transistor, a source follower transistor that outputs the pixel block readout, and a selection transistor that selects the unit pixel block. In more detail, some of the multiple unit pixels (e.g., four unit-pixels among the 8 unit-pixels) may share one floating diffusion region, and the remaining unit pixels (e.g., the remaining four unit pixels) may share another floating diffusion region. Two floating diffusion regions may be interconnected through conductive lines, resulting in formation of one common node (hereinafter referred to as a common floating diffusion node). Each unit pixel may include a photoelectric conversion element for generating photocharges through conversion of incident light received from the outside, and a transfer transistor for transmitting photocharges generated from the photoelectric conversion element to the floating diffusion region. Specifically, each unit pixel block (PB) may include a plurality of conversion gain capacitors and a plurality of conversion gain transistors. The conversion gain capacitors and the conversion gain transistors may adjust a conversion gain of the image sensing device by changing capacitance of a common floating diffusion node. Here, the conversion gain capacitors may operate as an impurity region formed by implanting impurities into an upper portion of a semiconductor substrate, and may be used as source/drain regions of the conversion gain transistors. Alternatively, the conversion gain capacitor may include a metal-insulator-metal (MIM) capacitor in which an insulation material is formed between metal plates. A detailed description of the conversion gain capacitors and the conversion gain transistors will be given later. The unit pixel block (PB) may output pixel signals of the unit pixels to the correlated double sampler (CDS) 200 through column lines.

As discussed above, each unit pixel block (PB) may output the pixel signal to the correlated double sampler (CDS) 200. CMOS image sensors may use the correlated double sampling (CDS) to remove an undesired offset value of pixels by sampling a pixel signal twice to remove the difference between these two samples. In one example, the correlated double sampling (CDS) may remove the undesired offset value of pixels by comparing pixel output voltages obtained before and after a light signal is incident on the pixels so that only pixel output voltages based on the incident light can be measured. In some embodiments of the disclosed technology, the correlated double sampler (CDS) 200 may sequentially sample and hold voltage levels of the reference signal and the image signal, which are provided to each of a plurality of column lines from the pixel array 100. For example, the correlated double sampler (CDS) 200 may perform sampling of a reference voltage level and a voltage level of the received pixel signal in response to a clock signal received from the timing generator 600, and may transmit an analog signal corresponding to a difference between the reference voltage level and the voltage level of the received pixel signal to the analog-to-digital converter (ADC) 300.

The analog-to-digital converter (ADC) 300 may be used to convert analog CDS signals to digital signals. In some implementations, the ADC 300 may be implemented as a ramp-compare type ADC. The ramp-compare type ADC may include a comparator circuit for comparing the analog pixel signal with a reference signal such as a ramp signal that ramps up or down, and a timer counts until a voltage of the ramp signal matches the analog pixel signal. In some embodiments of the disclosed technology, the ADC 300 may convert the correlate double sampling signal generated by the CDS 200 for each of the columns into a digital signal, and output the digital signal. The ADC 300 may perform a counting operation and a computing operation based on the correlate double sampling signal for each of the columns and a ramp signal received from the ramp signal generator 800. In this way, the ADC 300 may eliminate or reduce noises such as reset noise arising from the imaging pixels when generating digital image data.

The ADC 300 may include a plurality of column counters. Each column of the pixel array 100 is coupled to a column counter, and image data can be generated by converting the correlate double sampling signals received from each column into digital signals using the column counter. In another embodiment of the disclosed technology, the ADC 300 may include a global counter to convert the correlate double sampling signals corresponding to the columns into digital signals using a global code provided from the global counter.

The buffer 400 may temporarily hold or latch each of the digital signals received from the analog-to-digital converter (ADC) 300, may sense or detect and amplify each of the digital signals, and may output each of the amplified digital signals. Therefore, the buffer 400 may include a memory (not shown) and a sense amplifier (not shown). The memory may store the count value, and the count value may be associated with output signals of the plurality of unit pixels PXs. The sense amplifier may sense and amplify each count value received from the memory.

The row driver 500 may be used to drive the pixel array 100 in response to an output signal of the timing generator 600. In some implementations, the row driver 500 may select one or more imaging pixels arranged in one or more rows of the pixel array 100. The row driver 500 may generate a row selection signal to select one or more rows among the plurality of rows. The row driver 500 may sequentially enable the pixel reset signal for resetting imaging pixels corresponding to at least one selected row, and the transmission signal for the pixels corresponding to the at least one selected row.

The timing generator 600 may generate a timing signal to control the row driver 500, the correlated double sampler (CDS) 200, the analog-to-digital converter (ADC) 300, and the ramp signal generator 800.

The control register 700 may generate control signals to control the ramp signal generator 800, the timing generator 600, and the buffer 400.

The ramp signal generator 800 may generate a ramp signal in response to a control signal of the control register 700 and a timing signal received from the timing generator 600, and may output the ramp signal to the analog-to-digital converter (ADC) 300.

Figure 2:
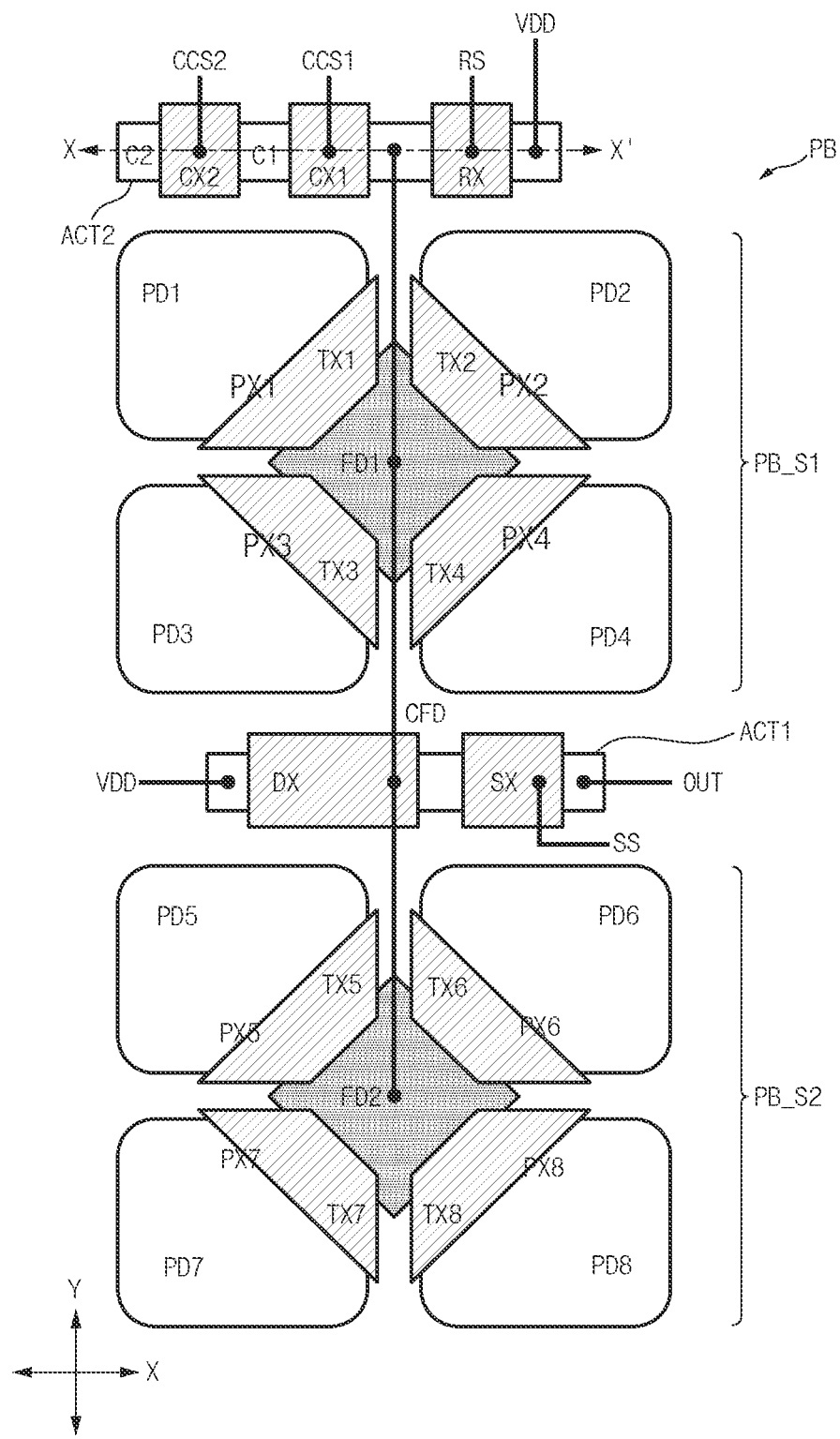
FIG. 2 is a schematic diagram illustrating an example of a unit pixel block shown in FIG. 1 based on some implementations of the disclosed technology.
Figure 3:
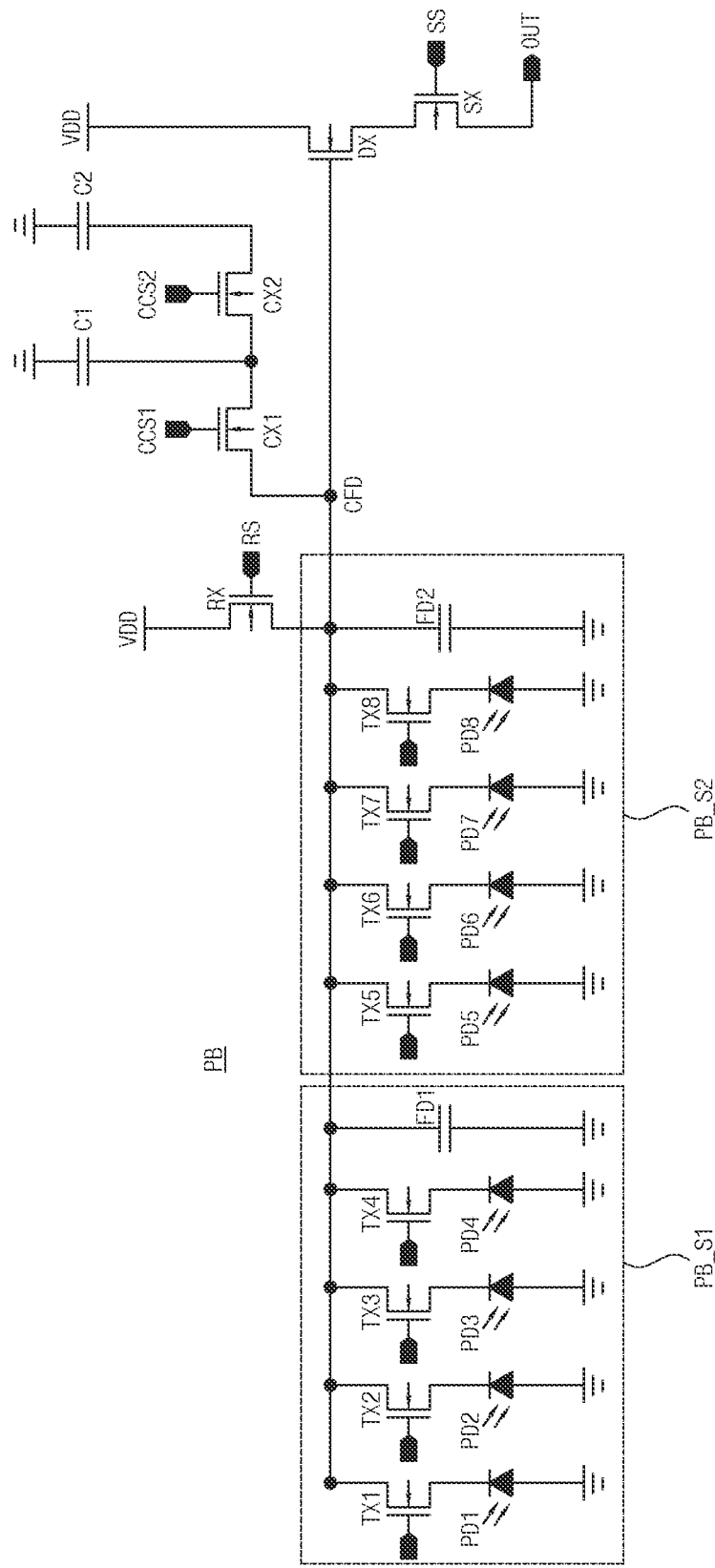
FIG. 3 is a circuit diagram illustrating an example of an equivalent circuit of the unit pixel block shown in FIG. 2 based on some implementations of the disclosed technology.

FIG. 2 is a schematic diagram illustrating an example of the unit pixel block shown in FIG. 1 based on some implementations of the disclosed technology. FIG. 3 is a circuit diagram illustrating an equivalent circuit of the unit pixel block shown in the specific example implementation in FIG. 2.

Referring to FIGS. 2 and 3, each unit pixel block (PB) may include a plurality of unit pixels PX1-PX8, a plurality of floating diffusion regions FD1 and FD2, a source follower transistor DX, a selection transistor SX, a reset transistor RX, conversion gain transistors CX1 and CX2, and conversion gain capacitors C1 and C2.

In FIG. 2, reference numerals DX, SX, RX, TX1-TX8, CX1, and CX2 are used to indicate gate electrodes of the corresponding transistors.

The unit pixels PX1, PX2, PX3, PX4, PX5, PX6, PX7, and PX8 may include photoelectric conversion elements PD1, PD2, PD3, PD4, PD5, PD6, PD7, and PD8, and transfer transistors TX1, TX2, TX3, TX4, TX5, TX6, TX7, and TX8, respectively. Here, each of the photoelectric conversion elements PD1-PD8 may generate photocharges in response to incident light. As illustrated in FIG. 2, four transfer transistors TX1-TX4 may transmit photocharges generated by the corresponding photoelectric conversion elements PD1-PD4 to their shared common floating diffusion region FD1, and four transfer transistors TX5-TX8 may transmit photocharges generated by the corresponding photoelectric conversion elements PD5-PD8 to their shared common floating diffusion region FD2. The unit pixel PX1 may include the photoelectric conversion element PD1 and the transfer transistor TX1 that transmits photocharges generated by the photoelectric conversion element PD1 to the floating diffusion region FD1. The unit pixel PX2 may include the photoelectric conversion element PD2 and the transfer transistor TX2 that transmits photocharges generated by the photoelectric conversion element PD2 to the floating diffusion region FD1. The unit pixel PX3 may include the photoelectric conversion element PD3 and the transfer transistor TX3 that transmits the photocharges generated by the photoelectric conversion element PD3 to the floating diffusion region FD1. The unit pixel PX4 may include the photoelectric conversion element PD4 and the transfer transistor TX4 that transmits photocharges generated by the photoelectric conversion element PD4 to the floating diffusion region FD1. The unit pixel PX5 may include the photoelectric conversion element PD5 and the transfer transistor TX5 that transmits photocharges generated by the photoelectric conversion element PD5 to the floating diffusion region FD2. The unit pixel PX6 may include the photoelectric conversion element PD6 and the transfer transistor TX6 that transmits photocharges generated by the photoelectric conversion element PD6 to the floating diffusion region FD2. The unit pixel PX7 may include the photoelectric conversion element PD7 and the transfer transistor TX7 that transmits the photocharges generated by the photoelectric conversion element PD7 to the floating diffusion region FD2. The unit pixel PX8 may include the photoelectric conversion element PD8 and the transfer transistor TX8 that transmits the photocharges generated by the photoelectric conversion element PD8 to the floating diffusion region FD2.

Each of the photoelectric conversion elements PD1-PD8 may include a photodiode, a phototransistor, a photogate, a pinned photodiode, or a combination thereof. In some implementations, each of the photoelectric conversion elements PD1-PD8 may include a P-type impurity region and an N-type impurity region. For example, the photoelectric conversion elements PD1-PD8 may be formed in a lower portion of the substrate by vertically stacking a P-type impurity region and an N-type impurity region.

The transfer transistors TX1-TX4 may be coupled to the corresponding photoelectric conversion elements PD1-PD4 and the floating diffusion region FD1. The transfer transistors TX5-TX8 may be coupled to the corresponding photoelectric conversion elements PD5-PD8 and the floating diffusion region FD2. For example, one terminal of the transfer transistor TX1, TX2, TX3 or TX4 may be coupled to the photoelectric conversion element PD1, PD2, PD3 or PD4, and the other terminal of the transfer transistor TX1, TX2, TX3 or TX4 may be coupled to the floating diffusion region FD1. One terminal of the transfer transistor TX5, TX6, TX7 or TX8 may be coupled to the photoelectric conversion element PD5, PD6, PD7 or PD8, and the other terminal of the transfer transistor TX5, TX6, TX7 or TX8 may be coupled to the floating diffusion region FD2. The transfer transistors TX1-TX4 may be turned on or off in response to transmission signals applied to transfer gates, such that the transfer transistors TX1-TX4 may transmit photocharges generated by the photoelectric conversion elements PD1-PD4 to the corresponding floating diffusion region FD1. The transfer transistors TX5-TX8 may be turned on or off in response to transmission signals applied to transfer gates, such that the transfer transistors TX5-TX8 may transmit photocharges generated by the photoelectric conversion elements PD5-PD8 to the corresponding floating diffusion region FD2.

The floating diffusion region FD1 may temporarily store photocharges received through the transfer transistors TX1-TX4. The floating diffusion region FD2 may temporarily store photocharges received through the transfer transistors TX5-TX8. Each of the floating diffusion regions FD1 and FD2 may include an impurity region that is formed by implanting impurities (e.g., N-type impurities) into an upper portion of the substrate to a predetermined depth. The floating diffusion regions FD1 and FD2 of each of the unit pixel blocks (PB) may be coupled to each other through conductive lines such as metal lines, resulting in formation of a common floating diffusion node CFD. That is, each unit pixel block (PB) may include an 8-shared pixel structure in which two floating diffusion regions FD1 and FD2 are commonly coupled to each other so that the two floating diffusion regions FD1 and FD2 are shared by multiple unit pixels (e.g., 8 unit-pixels PX1-PX8). The common floating diffusion node CFD may be coupled to a gate of source follower transistor DX, an impurity region, such as a source/ drain region, of a reset transistor RX, and an impurity region, such as a source/drain region, of a conversion gain transistor CX1 through conductive lines. In this patent document, the term "impurity region" is used to indicate a drain region or a source region of a transistor.

The multiple unit-pixels (e.g., 8 unit-pixels PX1-PX8) contained in the unit pixel block (PB) may be grouped into two subgroups. In a particular implementation where the unit pixel block (PB) includes eight unit-pixels PX1-PX8, four of the eight unit pixels PX1-PX8 share one floating diffusion region and the remaining four unit pixels share the other floating diffusion region. For example, four unit-pixels PX1-PX4 may be arranged to surround the floating diffusion region FD1 and share the floating diffusion region FD1. The remaining four unit-pixels PX5-PX8 may be arranged to surround the floating diffusion region FD2 and share the floating diffusion region FD2.

In an implementation where the unit pixel block (PB) is divided into first and second subpixel blocks PB_S1 and PB_S2, the first subpixel block PB_S1 includes four of unit-pixels PX1-PX8 and a first shared floating diffusion region, and the second subgroup PB_S2 includes the other four of the unit-pixels PX1-PX8 and a second shared floating diffusion region. The four unit-pixels of the first subpixel block PB_S1 share a first single floating diffusion region within the unit pixel block (PB), and the other four unit-pixels of the second subpixel block PB_S2 share a second single floating diffusion region within the unit pixel block (PB). For example, as shown in FIG. 2, the subpixel block PB_S1 may include the floating diffusion region FD1 and four unit-pixels PX1-PX4 configured to share the floating diffusion region FD1. In addition, the subpixel block PB_S2 may include the floating diffusion region FD2 and four unit-pixels PX5-PX8 configured to share the floating diffusion region FD2.

In the unit pixel block PB, the first subpixel block PB_S1 and the second subpixel block PB_S2 may be spaced apart from each other by a predetermined distance in a Y-axis direction. The first subpixel block PB_S1 may be identical (or similar) in structure and size to the second subpixel block PB_S2.

The source follower transistor DX and the selection transistor SX may be arranged between the subpixel blocks PB_S1 and PB_S2. In an X-axis direction, the source follower transistor DX and the selection transistor SX may be arranged in a row. The source follower transistor DX and the selection transistor SX may be coupled in series between a power-supply voltage (VDD) node VDD and an output node OUT. The source follower transistor DX may output a signal corresponding to the magnitude of voltage of the common floating diffusion node CFD, and the selection transistor SX may transmit an output signal of the source follower transistor DX to the output node OUT based on a selection signal SS. That is, in some implementations of the disclosed technology, the conversion gain of the unit pixel contained in the image sensing device can be determined based on the capacitance of the common floating diffusion node CFD.

A gate (gate electrode) of the source follower transistor DX and a gate of the selection transistor SX may be arranged in a row over a single active region ACT1 while being spaced apart from each other by a predetermined distance in the X-axis direction. In the active region ACT1, an impurity region (i.e., a source or drain region) next to the gate of the source follower transistor DX may be coupled to the power-supply voltage node VDD, and an impurity region (i.e., a source or drain region) next to the gate of the selection transistor SX may be coupled to the output node OUT. The gate of the source follower transistor DX may be coupled to the common floating diffusion node CFD. A selection signal SS may be applied to the gate of the selection transistor SX.

The reset transistor RX and the conversion gain transistors CX1 and CX2 may be arranged in a row along the other side of the subpixel block PB_S1. The reset transistor RX may be coupled to the power-supply voltage node VDD and the common floating diffusion node CFD, and may initialize the common floating diffusion node CFD to a power-supply voltage level based on a reset signal RS. The conversion gain transistors CX1 and CX2 may be coupled in series to the common floating diffusion node CFD, and may change or adjust the capacitance of the common floating diffusion node CFD based on conversion gain control signals CCS1 and CCS2.

The gate of the reset transistor RX and the gates of the conversion gain transistors CX1 and CX2 may be arranged in a row over a single active region ACT2 while being spaced apart from each other by a predetermined distance in the X-axis direction. In the active region ACT2, an impurity region next to the gate of the reset transistor RX may be coupled to the common floating diffusion node CFD, and the other impurity region next to the gate of the reset transistor RX may be coupled to the power-supply voltage node VDD. In the active region ACT2, one region next to the gate of the conversion gain transistor CX1 may be coupled to the common floating diffusion node CFD, and a gap region between the gates of the conversion gain transistors CX1 and CX2 may be coupled to the conversion gain capacitor C1. In the active region ACT2, the other region next to the gate of the conversion gain transistor CX2 may be coupled to the conversion gain capacitor C2. In this case, each of the conversion gain capacitors C1 and C2 may include a junction capacitor formed by implanting impurities into an upper portion of the active region ACT2. The conversion gain capacitors C1 and C2 may have the same capacitance or may have different capacitances.

The conversion gain control signal CCS1 may be applied to the gate of the conversion gain transistor CX1, and the conversion gain control signal CCS2 may be applied to the gate of the conversion gain transistor CX2. The conversion gain control signals CCS1 and CCS2 may be received from the row driver 500. The conversion gain transistor CX1 may be turned on or off in response to the conversion gain control signal CCS1, and the conversion gain transistor CX2 may be turned on or off in response to the conversion gain control signal CCS2. As a result, the conversion gain transistors CX1 and CX2 may enable the conversion gain capacitors C1 and C2 to be selectively coupled to the common floating diffusion node CFD, thereby adjusting or changing the capacitance of the common floating diffusion node CFD.

For example, when the conversion gain transistors CX1 and CX2 are turned off, the capacitance of the common floating diffusion node CFD would be the sum of capacitances of the floating diffusion regions FD1 and FD2. In this case, the image sensing device may have the highest conversion gain.

When the conversion gain transistor CX1 is turned on and the conversion gain transistor CX2 is turned off, the conversion gain capacitor C1 may be coupled in parallel to the floating diffusion regions FD1 and FD2. Therefore, the capacitance of the common floating diffusion node CFD would be the sum of capacitance of the conversion gain capacitor C1 and capacitances of the floating diffusion regions FD1 and FD2.

When the conversion gain transistors CX1 and CX2 are turned on, the conversion gain capacitors C1 and C2 may be coupled in parallel to the floating diffusion regions FD1 and FD2. Accordingly, the capacitance of the common floating diffusion node CFD would be the sum of capacitances of the floating diffusion regions FD1 and FD2 and capacitances of the conversion gain capacitors C1 and C2. In this case, the image sensing device may have the lowest conversion gain.

The image sensing device based on some implementations of the disclosed technology may turn on or off the conversion gain transistors CX1 and CX2 according to the intensity of light to adjust the capacitance of the common floating diffusion node CFD, thereby more precisely adjusting the conversion gain.

Although FIGS. 2 and 3 illustrate only two conversion gain transistors CX1 and CX2 that are coupled in series to each other by way of example, it should be noted that other implementations can include more than two conversion gain transistors can also be coupled in series to each other.

Figure 4A:
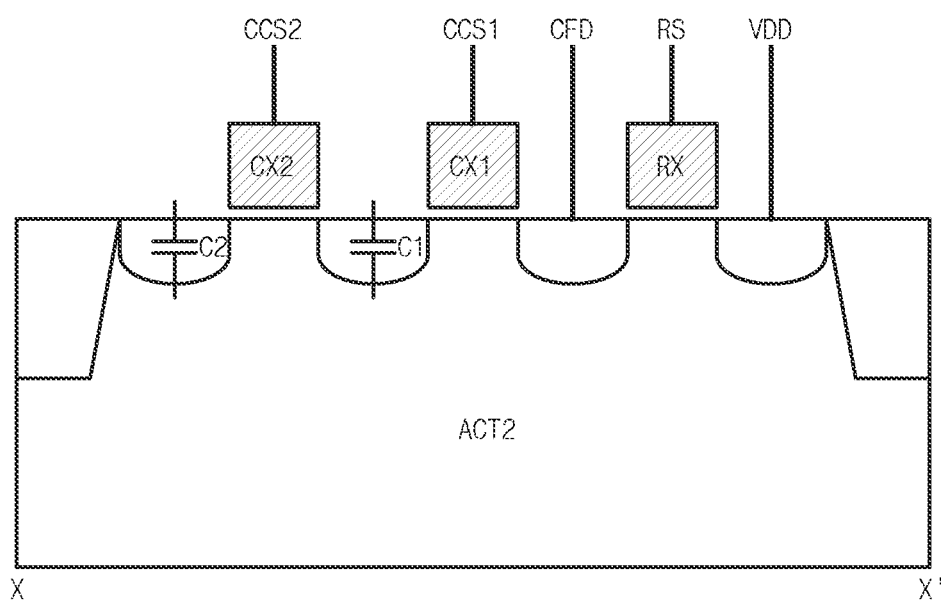
FIGS. 4A and 4B are cross-sectional views illustrating examples of the unit pixel block taken along the line X-X' shown in FIG. 2 based on some implementations of the disclosed technology.
Figure 4B:
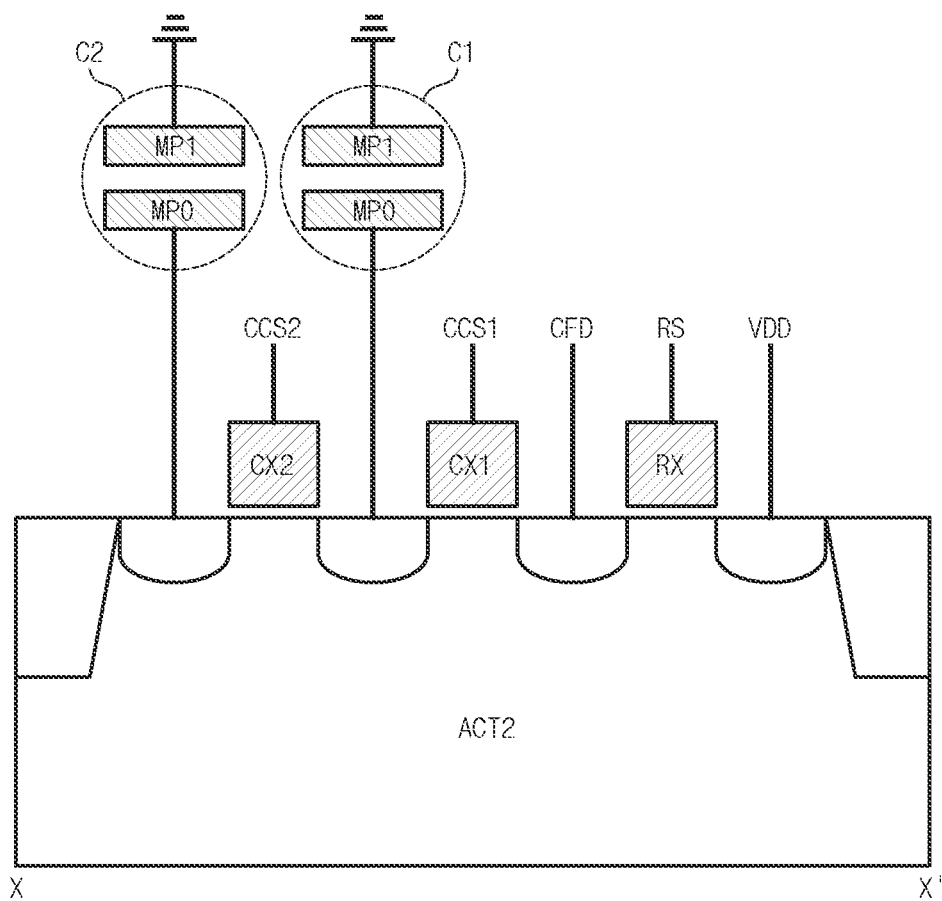

FIGS. 4A and 4B are cross-sectional views illustrating examples of the unit pixel block taken along the line X-X' shown in FIG. 2 based on some implementations of the disclosed technology.

Referring to FIG. 4, each of the conversion gain capacitors C1 and C2 may include a junction capacitor formed by implanting impurities into an upper portion of the active region ACT2. For example, each of the conversion gain capacitors C1 and C2 may include an impurity region coupled to the source/drain regions of the conversion gain transistors CX1 and CX2. In some implementations, the conversion gain capacitor C1 may include an impurity region coupled to the source/drain regions of the conversion gain transistors CX1 and CX2, and the conversion gain capacitor C2 may include an impurity region coupled to the source/drain region of the conversion gain transistor CX2.

Referring to FIG. 4B, each of the conversion gain capacitors C1 and C2 may include a metal-insulator-metal (MIM) capacitor in which an insulation material is formed between two metal plates MP0 and MP1 disposed over the unit pixel block (PB). The metal-insulator-metal (MIM) capacitors may be coupled to the source/drain regions of the conversion gain transistors CX1 and CX2.

In this case, the metal plate MP0 may be formed simultaneously with formation of conductive lines of a metal layer MO, and the metal plate MP1 may be formed simultaneously with formation of conductive lines of a metal layer M2.

Figure 5:
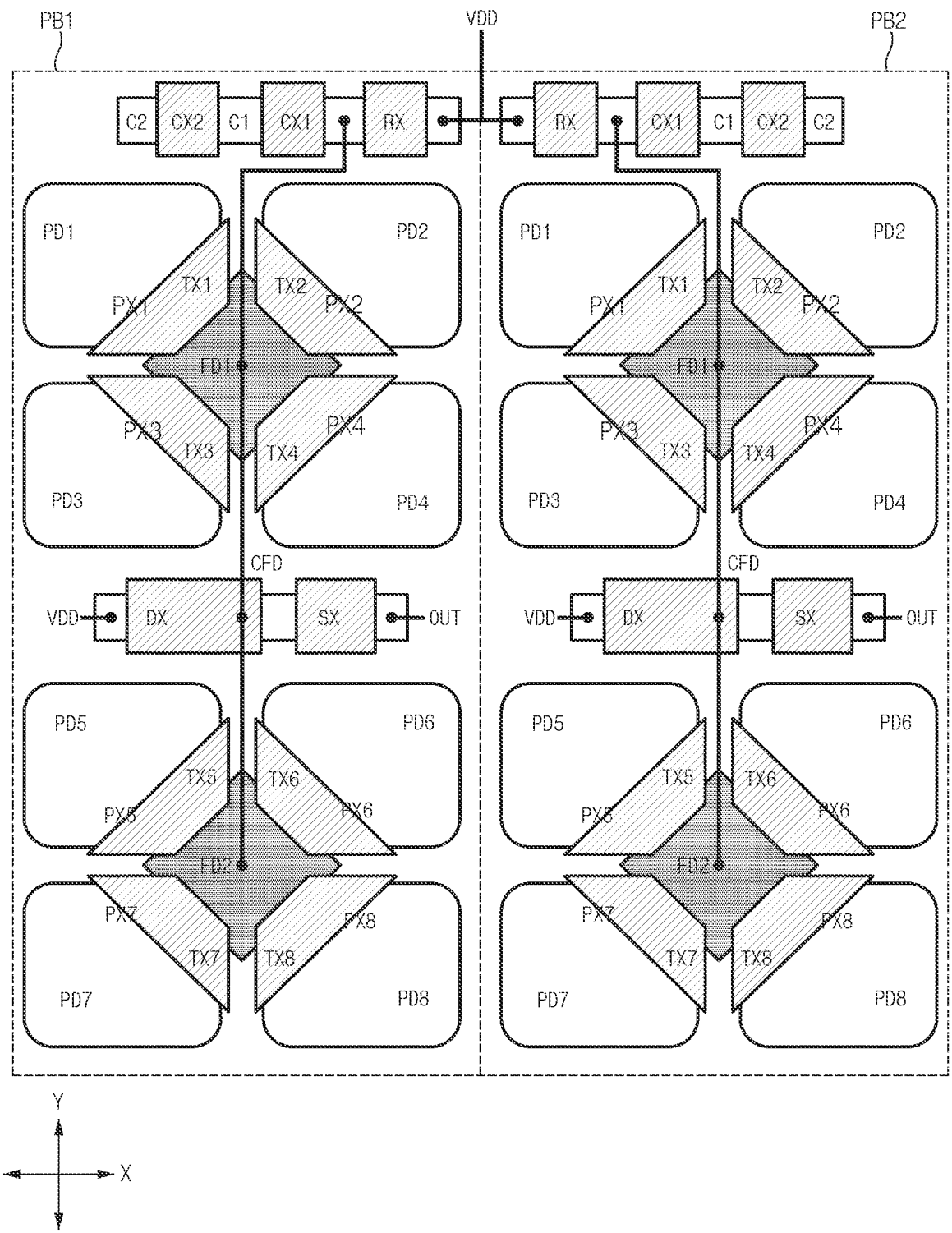
FIG. 5 is a schematic diagram illustrating another example of the unit pixel block shown in FIG. 1 based on some implementations of the disclosed technology.

FIG. 5 is a schematic diagram illustrating another example of the unit pixel block shown in FIG. 1 based on some implementations of the disclosed technology. FIG. 5 illustrates a layout structure of the unit pixel block in which two unit pixel blocks are consecutively arranged.

Referring to FIG. 5, the reset transistor RX and the conversion gain transistors CX1 and CX2 of the first unit pixel block PB1 may be arranged symmetrically to the reset transistor RX and the conversion gain transistors CX1 and CX2 of the second unit pixel block PB2 with respect to a boundary line between the first unit pixel block PB1 and the second unit pixel block PB2 adjacent to the first unit pixel block PB1. That is, the reset transistor RX and the conversion gain transistors CX1 and CX2 of the first unit pixel block PB1 and the reset transistor RX and the conversion gain transistors CX1 and CX2 of the second unit pixel block PB2 may be arranged in a flip structure in which the corresponding constituent elements (transistors) of the first and second unit pixel blocks PB1 and PB2 are identical in size to each other and the arrangement order of the constituent elements of the first unit pixel block PB1 is opposite to the arrangement order of the constituent elements of the second unit pixel block PB2.

As described above, since the reset transistor RX and the conversion gain transistors CX1 and CX2 of the first unit pixel block PB1 and the reset transistor RX and the conversion gain transistors CX1 and CX2 of the second unit pixel block PB2 are arranged in a flip structure, the reset transistor RX of the first unit pixel block PB1 is located adjacent to the reset transistor RX of the second unit pixel block PB2, such that the first and second unit pixel blocks PB1 and PB2 adjacent to each other can share the power-supply voltage node VDD.

On the other hand, the source follower transistor DX and the selection transistor SX of the first unit pixel block PB1 may be identical (or similar) in structure to the source follower transistor DX and the selection transistor SX of the second unit pixel block PB2.

In the pixel array 100, one pair of the unit pixel blocks PB1 and PB2 may be consecutively arranged in X-axis and Y-axis directions.

Figure 6:
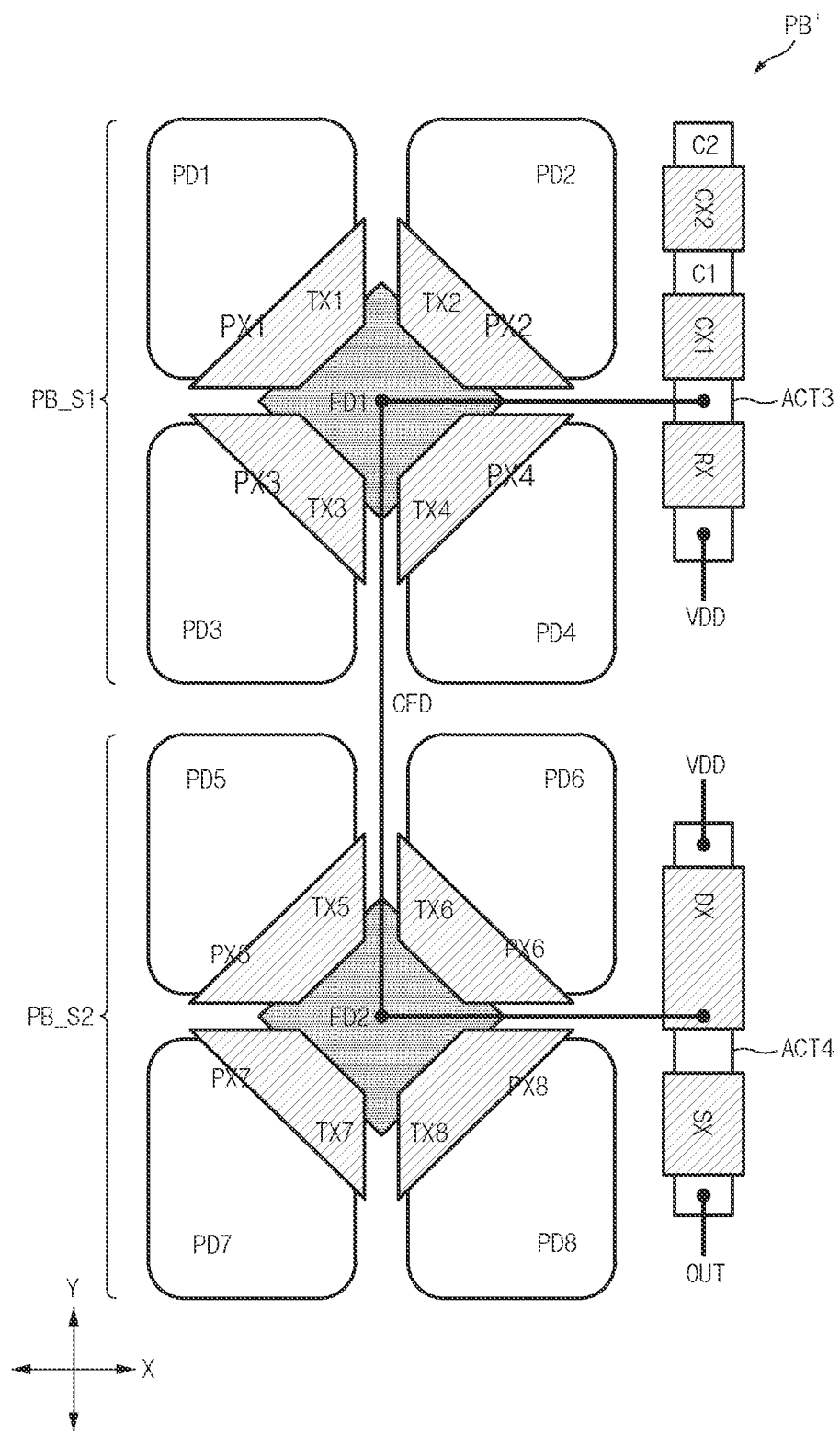
FIG. 6 is a schematic diagram illustrating still another example of the unit pixel block shown in FIG. 1 based on some implementations of the disclosed technology.

FIG. 6 is a schematic diagram illustrating still another example of the unit pixel block shown in FIG. 1 based on some implementations of the disclosed technology.

Different from the unit pixel block (PB) shown in FIG. 2, the unit pixel block (PB') shown in FIG. 6 may include pixel transistors DX, SX, RX, CX1, and CX2 that are arranged in a row in a Y-axis direction.

For example, the reset transistor RX and the conversion gain transistors CX1 and CX2 may be disposed at one side of the subpixel block PB_S1 in an X-axis direction. A gate of the reset transistor RX and gates of the conversion gain transistors CX1 and CX2 may be linearly disposed in a Y-axis direction over one active region ACT3 while being spaced apart from each other by a predetermined distance in the Y-axis direction. In addition, the source follower transistor DX and the selection transistor SX may be disposed at one side of the second subpixel block PB_S2 in an X-axis direction. The gate of the source follower transistor DX and the gate of the selection transistor SX may be linearly disposed in a Y-axis direction over one active region ACT4 while being spaced apart from each other by a predetermined distance in the Y-axis direction.

In some implementations, the electrical connection between the floating diffusion regions FD1 and FD2, the pixel transistors DX, SX, RX, CX1, and CX2, and the conversion gain capacitors C1 and C2 contained in the unit pixel block (PB') shown in FIG. 6 is identical (or similar) to those of FIGS. 2 and 3.

As is apparent from the above description, the image sensing device based on some implementations of the disclosed technology can adjust the capacitance of the common floating diffusion region in various sizes.

Although a number of illustrative embodiments have been described, it should be understood that various modifications of the disclosed embodiments and other embodiments can be devised based on what is described and/or illustrated in this patent document.

What is claimed is:
1. An image sensing device comprising:
a pixel array including a plurality of subarrays consecutively arranged in the pixel array, each subarray including a first unit pixel block and a second unit pixel block adjacent to each other,
wherein each of the first and second unit pixel blocks includes:

a first subpixel block including a first floating diffusion region and a plurality of unit pixels sharing the first floating diffusion region;

a second subpixel block including a second floating diffusion region and a plurality of unit pixels sharing the second floating diffusion region, the second floating diffusion region being configured to form a common floating diffusion node by connecting to the first floating diffusion region; and a first transistor array and a second transistor array respectively disposed at opposing sides of the first subpixel block, wherein the first transistor array includes:

a plurality of conversion gain transistors configured to adjust a capacitance of the common floating diffusion node based on a plurality of conversion gain control signals; and a reset transistor configured to initialize the common floating diffusion node based on a reset signal, wherein the first transistor array of the first unit pixel block and the first transistor array of the second unit pixel block are arranged symmetrically.

2. The image sensing device according to claim 1, wherein the second transistor array includes:

a source follower transistor and a selection transistor that are coupled in series between a power-supply voltage node and an output node.

3. The image sensing device according to claim 2, wherein:

the second transistor array of the first unit pixel block and the second transistor array of the second unit pixel block are arranged to have the same structure.

4. The image sensing device according to claim 1, wherein the first transistor array is formed in one active region.

5. The image sensing device according to claim 1, wherein the plurality of conversion gain transistors includes:

a first conversion gain transistor configured to include a first impurity region coupled to the common floating diffusion node, and a second impurity region coupled to a first conversion gain capacitor; and a second conversion gain transistor configured to include a third impurity region coupled to the second impurity region of the first conversion gain transistor, and a fourth impurity region coupled to a second conversion gain capacitor.

6. The image sensing device according to claim 5, wherein each of the first and second conversion gain capacitors includes:

a junction capacitor including impurities formed in an active region including the first transistor array.

7. The image sensing device according to claim 5, wherein each of the first and second conversion gain capacitors includes a metal-insulator-metal (MIM) capacitor.

8. The image sensing device according to claim 5, wherein:

the first conversion gain capacitor and the second conversion gain capacitor have the same capacitance.

9. The image sensing device according to claim 5, wherein:

the first conversion gain capacitor and the second conversion gain capacitor have different capacitances.

* * * * *